United States Patent
Lee

(10) Patent No.: US 10,345,390 B2
(45) Date of Patent: Jul. 9, 2019

(54) METHOD AND APPARATUS FOR CORRECTING ERROR OCCURRING IN ESTIMATION OF BATTERY LIFE

(71) Applicant: Samsung Electronics Co., Ltd., Suwon-si (KR)

(72) Inventor: Sun Jae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 673 days.

(21) Appl. No.: 14/496,880

(22) Filed: Sep. 25, 2014

(65) Prior Publication Data

US 2015/0301122 A1    Oct. 22, 2015

(30) Foreign Application Priority Data

Apr. 18, 2014 (KR) .................. 10-2014-0046640

(51) Int. Cl.
*G01R 31/367* (2019.01)
*G01R 31/392* (2019.01)

(52) U.S. Cl.
CPC .......... *G01R 31/392* (2019.01); *G01R 31/367* (2019.01)

(58) Field of Classification Search
CPC .................................... G01R 31/3679
See application file for complete search history.

(56) References Cited

U.S. PATENT DOCUMENTS

| | | | |
|---|---|---|---|
| 2003/0169019 A1 | 9/2003 | Oosaki | |
| 2010/0036626 A1* | 2/2010 | Kang | G01R 31/3679 702/63 |
| 2012/0078549 A1 | 3/2012 | Oh et al. | |
| 2012/0136594 A1 | 5/2012 | Tang et al. | |
| 2013/0085696 A1* | 4/2013 | Xu | B60L 3/12 702/63 |
| 2014/0009123 A1* | 1/2014 | Park | G01R 31/361 320/152 |
| 2014/0232411 A1* | 8/2014 | Vaidya | G01R 31/3624 324/426 |
| 2014/0333265 A1* | 11/2014 | Kinjo | G01R 31/3624 320/134 |
| 2015/0120225 A1* | 4/2015 | Kim | G01R 31/3679 702/63 |
| 2015/0268307 A1* | 9/2015 | Inguva | G01R 31/3648 702/63 |

FOREIGN PATENT DOCUMENTS

| | | |
|---|---|---|
| JP | 2003-9423 A | 1/2003 |
| JP | 2005-224047 A | 8/2005 |
| JP | 2008-210020 A | 9/2008 |
| JP | 2010-127880 A | 6/2010 |
| KR | 10-0680901 B1 | 2/2007 |
| KR | 10-2012-0046355 A | 5/2012 |
| KR | 10-1307480 B1 | 9/2013 |

* cited by examiner

*Primary Examiner* — Manuel L Barbee
*Assistant Examiner* — Raymond L Nimox
(74) *Attorney, Agent, or Firm* — NSIP Law

(57) ABSTRACT

An apparatus and method for correcting an error occurring in estimation of a life of a battery. Either one or both of usage information and battery environment information are collected, and a weight corresponding to the either one or both of the battery usage information and the battery environment information may be calculated from a battery degradation model. The calculated weight may be reflected on a state of health (SOH), and the SOH may be corrected.

22 Claims, 14 Drawing Sheets

METHOD AND APPARATUS FOR CORRECTING ERROR OCCURRING IN ESTIMATION OF BATTERY LIFE

CROSS-REFERENCE TO RELATED APPLICATIONS

This application claims the benefit under 35 USC 119(a) of Korean Patent Application No. 10-2014-0046640 filed on Apr. 18, 2014, in the Korean Intellectual Property Office, the entire disclosure of which is incorporated herein by reference for all purposes.

BACKGROUND

1. Field

The following description relates to an apparatus and method for estimating a life of a battery.

2. Description of Related Art

In electric vehicles, electricity is used as an energy source. Electric vehicles are classified based on their structure into hybrid electric vehicles, plug-in electric vehicles, battery electric vehicles, and other classifications known to one of ordinary skill in the art.

In a current car market, eco-friendly cars, for example, hybrid electric vehicles, are being sold. In a hybrid electric vehicle, a battery and an internal combustion engine are combined. For example, a hybrid electric vehicle may have a very high fuel efficiency compared to an existing internal combustion engine. Additionally, an electric vehicle using only a battery as an energy source instead of including an internal combustion engine is also being sold.

Vehicles using electricity as an energy source may include secondary batteries capable of being charged and discharged. For example, in various types of secondary batteries, a secondary battery using lithium (Li) ion technology has a high capacity for its weight, and provides a high energy output. Accordingly, the secondary battery may be suitable for use as an energy source of an electric vehicle.

A time to replace a battery in an electric vehicle may be estimated by a state of health (SOH). Typically, an SOH may be estimated based on a capacity of a battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for correcting an error occurring in estimation of a life of a battery includes a collector configured to collect either one or both of battery usage information and battery environment information; a model storage configured to store a battery degradation model obtained by modeling a degradation in the battery caused by a use and an environment of the battery; and an error corrector configured to correct an estimated life of the battery based on the battery degradation model and the either one or both of the battery usage information and the battery environment information.

The error corrector may be further configured to calculate a weight corresponding to the either one or both of the battery usage information and the battery environment information from the battery degradation model, and correct the estimated life of the battery based on the weight.

The battery degradation model may include at least one life degradation parameter used to reduce the life of the battery, and a degree of influence of the at least one life degradation parameter on a reduction in the life of the battery.

The model storage may be further configured to store at least one normalized battery degradation model obtained by respectively normalizing a degradation in the battery by the at least one life degradation parameter; and the error corrector may be further configured to calculate a weight corresponding to the either one or both of the battery usage information and the battery environment information based on the degree of influence and the at least one normalized battery degradation model, and correct the estimated life of the battery based on the weight.

The error corrector may be further configured to calculate periods of time in which the battery is degraded from the either one or both of the battery usage information and the battery environment information, calculate a weight corresponding to the accumulated periods of time, and correct the estimated life of the battery based on the weight.

The battery degradation model may include a model corresponding to a degradation in the battery caused by a rapid discharge of the battery; a model corresponding to a degradation in the battery caused by a rapid charge of the battery; a model corresponding to a full charge of the battery; and a model corresponding to a degradation in the battery based on a period of time in which the battery is exposed to a predetermined temperature range.

The battery usage information may include any one or any combination of information associated with a rapid discharge of the battery, information associated with a rapid charge of the battery, and information associated with a full charge of the battery.

The battery environment information may include either one or both of information associated with a temperature to which the battery is exposed, and information associated with a period of time in which the battery is exposed to a predetermined temperature range.

The apparatus may further include an estimator configured to estimate a state of health (SOH) corresponding to the estimated life of the battery using a coulomb counting scheme.

The battery may be mounted in an electric vehicle.

In another general aspect, a method of correcting an error occurring in estimation of a life of a battery includes estimating a state of health (SOH) corresponding to the life of the battery; collecting either one or both of battery usage information and battery environment information; and correcting the estimated SOH based on a battery degradation model stored in advance and the either one or both of the battery usage information and the battery environment information.

The correcting may include calculating a weight corresponding to the either one or both of the battery usage information and the battery environment information from the battery degradation model; and correcting the estimated SOH based on the weight.

The battery degradation model may include at least one life degradation parameter used to reduce the life of the battery, and a degree of influence of the at least one life degradation parameter on a reduction in the life of the battery.

The method may further include storing in advance at least one normalized battery degradation model obtained by respectively normalizing a degradation in the battery by the at least one life degradation parameter; and the correcting may include calculating a weight corresponding to either one or both of the battery usage information and the battery environment information based on the degree of influence and the at least one normalized battery degradation model; and correcting the estimated SOH based on the weight.

The correcting may include accumulating periods of time in which the battery is degraded from the either one or both of the battery usage information and the battery environment information; calculating a weight corresponding to the accumulated periods of time; and correcting the estimated SOH based on the weight.

The battery degradation model may include a model corresponding to a degradation in the battery caused by a rapid discharge of the battery; a model corresponding to a degradation in the battery caused by a rapid charge of the battery; a model corresponding to a full charge of the battery; and a model corresponding to a degradation in the battery based on a period of time in which the battery is exposed to a predetermined temperature range.

The battery usage information may include any one or any combination of information associated with a rapid discharge of the battery, information associated with a rapid charge of the battery, and information associated with a full charge of the battery.

The battery environment information may include either one or both of information associated with a temperature to which the battery is exposed, and information associated with a period of time in which the battery is exposed to a predetermined temperature range.

The estimating may include estimating the SOH using a coulomb counting scheme.

In another general aspect, a non-transitory computer-readable storage medium stores a program to control a computer to perform the method described above.

Other features and aspects will be apparent from the following detailed description, the drawings, and the claims.

DETAILED DESCRIPTION

Figure 1:
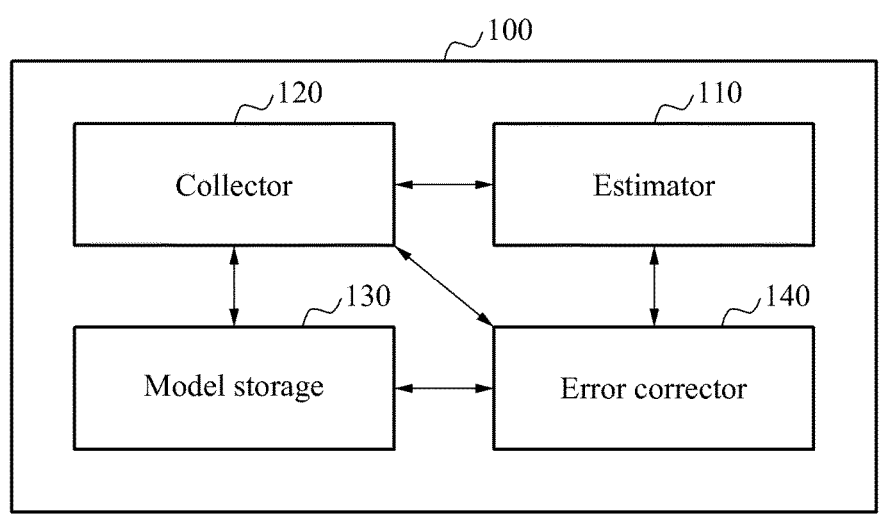
FIG. 1 illustrates an example of an apparatus for correcting an error occurring in estimation of a life of a battery.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

A lithium ion secondary battery is rechargeable. When heat of a lithium ion secondary battery is carelessly managed, a risk of explosion may exist. To maximally reduce the risk of explosion of the lithium ion secondary battery, a battery may be managed by a battery management system (BMS). In the following description, a battery may be a lithium ion secondary battery, but is not limited thereto, and accordingly the battery may any battery capable of being charged and discharged.

The BMS may reduce a risk of explosion of a battery, and may increase a life of the battery. For example, the BMS may notify a user of a time to replace a battery. When a battery is used for a predetermined period of time, performance of the battery may be reduced due to a degradation in the battery, for example, aging of the battery. Accordingly, the user may need to replace the battery.

In an example in which a capacity of a battery at a time of manufacturing of the battery is assumed to be 100%, when the capacity of the battery is reduced to 80% due to use of the battery, the battery may need to be replaced. When the capacity of the battery is equal to or less than 80%, an output of the battery may be reduced, and a power loss may increase during charging and discharging. Accordingly, it may be difficult to use the battery.

The time to replace the battery may be estimated based on a state of health (SOH). The SOH may be obtained by quantifying a life of the battery. Typically, the SOH may be estimated based on a capacity of a battery. To notify a user of a battery replacement time, it is important for the BMS to accurately measure the SOH.

To accurately measure the SOH of an electric vehicle that uses a battery as an energy source, a plurality of environmental factors need to be considered. For example, the environmental factors may include an example in which a battery is exposed to a high temperature state for a relatively long period of time, an example in which a battery is exposed to a low temperature state for a relatively long period of time, an example in which a battery is not used for a predetermined period of time after being fully charged, an example in which a battery is not used for a predetermined period of time when the battery is fully discharged, and an example in which a battery is rapidly discharged due to sudden acceleration or sudden deceleration of the electric vehicle.

For example, when a battery continues to be exposed to a high temperature, a capacity of the battery may be reduced by about 10%. In another example, when the battery is exposed to a low temperature, the capacity of the battery may be reduced by at least 10%.

In one example, a life degradation parameter having an influence on accuracy of an SOH estimated for a battery may be defined in advance, and a degree of influence of life degradation parameters on an SOH may be set in advance.

For example, an apparatus for correcting an error occurring in estimation of a life of a battery may determine a degree of influence of a complex use factor and an environmental factor of the battery on an SOH value. The SOH value may be estimated based on a change in a capacity of the battery calculated by a current, a voltage, a temperature, and other parameters of the battery known to one of ordinary skill in the art. The degree of influence may be applied to an SOH, and accordingly an accurate SOH may be measured.

In one example, an apparatus for correcting an error occurring in estimation of a life of a battery may define, in advance, a life degradation parameter that has a direct influence on a battery degradation. The life degradation parameter may not be required in a typical SOH estimation scheme, for example, estimating an SOH based on development of a change in a capacity of a battery calculated based on a current, a voltage, a temperature, and other parameters of the battery known to one of ordinary skill in the art. A weight may be calculated from a degree of influence of the life degradation parameter on the battery degradation, and accordingly an accuracy of SOH estimation may be increased.

In the following description, a battery life may refer to a remaining capacity of a battery, and may be indicated by an SOH.

FIG. 1 illustrates an example of an apparatus 100 for correcting an error occurring in estimation of a life of a battery.

Referring to FIG. 1, the apparatus 100 includes an estimator 110, a collector 120, a model storage 130, and an error corrector 140. For example, the apparatus 100 may estimate a life of a battery mounted in an electric vehicle.

The estimator 110 estimates an SOH corresponding to the life of the battery. For example, the estimator 110 may estimate an SOH based on a quantity of electricity stored in a battery computed using a coulomb counting scheme during charging or discharging. The quantity of electricity may be represented as shown in Equation 1 below. The estimated SOH may be represented as shown in Equation 2 below.

$$\int_{t0}^{t1} \Delta i\, dt [Ah] \qquad \text{[Equation 1]}$$

$$SOH_{old}(\%) = \frac{C_{current}}{C_{initial}} * 100 \qquad \text{[Equation 2]}$$

In Equation 1, $\Delta i$ denotes an amount of current of the battery. In Equation 2, $SOH_{old}$ denotes an SOH calculated by the estimator 110, and has a value that has not been corrected by the error corrector 140. $C_{current}$ denotes a current value of a capacity of the battery that is computed by the coulomb counting scheme of Equation 1, and $C_{initial}$ denotes an initial value of a capacity of the battery.

However, the estimating of the SOH is not limited to using the coulomb counting scheme, and the estimator 110 may estimate the SOH based on various other criteria, for example, a change in a value of an internal resistance of a battery, a voltage drop, a self-discharge, an ability to accept a charge, a number of charge-discharge cycles, and other criteria known to one of ordinary skill in the art.

For example, an error may occur in the SOH estimated by the estimator 110 because a use factor, an environmental factor, and other factors of the battery are not reflected in the SOH. Additionally, an electric vehicle operating in the real world may be rarely fully discharged and have a long rest time, and accordingly a greater error may occur in the SOH estimated by the estimator 110.

The collector 120 collects either one or both of battery usage information and battery environment information. The battery usage information may include information associated with a use factor of a battery, and the battery environment information may include information associated with an environmental factor of a battery. For example, the collector 120 may receive, from a BMS, information on a temperature of a battery, information regarding whether a battery is rapidly charged, and other information.

The battery usage information may include, for example, information associated with a rapid discharge of a battery, information associated with a rapid charge of a battery, and information associated with a full charge of a battery, and information associated with a regenerative brake. The information associated with the rapid discharge of the battery may include a period of time in which the battery is rapidly discharged, and a number of times that the battery is rapidly discharged. The information associated with the rapid charge of the battery may include a period of time in which the battery is rapidly charged, and a number of times that the battery is rapidly charged. The information associated with the full charge of the battery may include a rest time in which a battery is maintained in a fully charged state, and other information. Examples of the battery usage information will be further described with reference to FIGS. 13 and 14. The information associated with the regenerative brake may include a charge amount of the battery charged by the regenerative brake, a number of times that regenerative braking occurs, and other information.

The battery environment information may include, for example, information associated with a temperature to which a battery is exposed, and a period of time in which a battery is exposed to a temperature range that is set in advance. The temperature to which the battery is exposed may be a temperature at which an electric vehicle with the battery moves or rests. The temperature range may indicate a high temperature, a low temperature, and room temperature. The high temperature may correspond to a temperature range of temperatures equal to or higher than a first temperature that is set in advance. The low temperature may correspond to a temperature range of temperatures equal to or lower than a second temperature that is set in advance. The room temperature may be higher than the second temperature and lower than the first temperature.

The model storage 130 stores a battery degradation model obtained by modeling a degradation in the battery caused by a usage and a environment of the battery. The battery degradation model may include, for example, a model corresponding to a degradation in the battery caused by a rapid discharge of the battery, a model corresponding to a degradation in the battery caused by a rapid charge of the battery, a model corresponding to a full charge of the battery, and a model corresponding to a degradation in the battery based on a period of time in which the battery is exposed to a temperature range that is set in advance.

Additionally, the battery degradation model may include at least one life degradation parameter, and a degree of influence of the at least one life degradation parameter. The at least one life degradation parameter may be used to reduce a life of a battery. The degree of influence indicates how much the life of the battery is reduced by the at least one life degradation parameter. The battery degradation model may include at least one normalized battery degradation model obtained by respectively normalizing a degradation in the battery by the at least one life degradation parameter.

The battery degradation model may include a set of weights to correct the estimated SOH. In one example, a normalized battery degradation model may include a set of offsets in which a weight is normalized. Battery degradation models may be generated in advance to be distinguished from each other for each life degradation parameter.

The battery degradation model will be further described with reference to FIGS. 8 through 11.

The error corrector 140 corrects the SOH estimated by the estimator 110 based on the battery degradation model and either one or both of the battery usage information and the battery environment information. For example, the error corrector 140 may calculate a weight corresponding to either one or both of the battery usage information and the battery environment information from the battery degradation model, and may correct the estimated SOH based on the calculated weight.

Additionally, the error corrector 140 may calculate a weight corresponding to either one or both of the battery usage information and the battery environment information based on a plurality of normalized battery degradation models and the degree of influence. For example, the error corrector 140 may reflect a degree of influence on a normalized battery degradation model, and may calculate a weight corresponding to the battery usage information and the battery environment information from the normalized battery degradation model on which the degree of influence is reflected.

The error corrector 140 may accumulate periods of time in which the battery is degraded from either one or both of the battery usage information and the battery environment information, and may calculate a weight corresponding to the accumulated periods of time.

The apparatus 100 may be used to estimate an SOH of a battery that is capable of being recharged and discharged and is used in an electronic device or a vehicle using a battery as an energy source.

Figure 2:
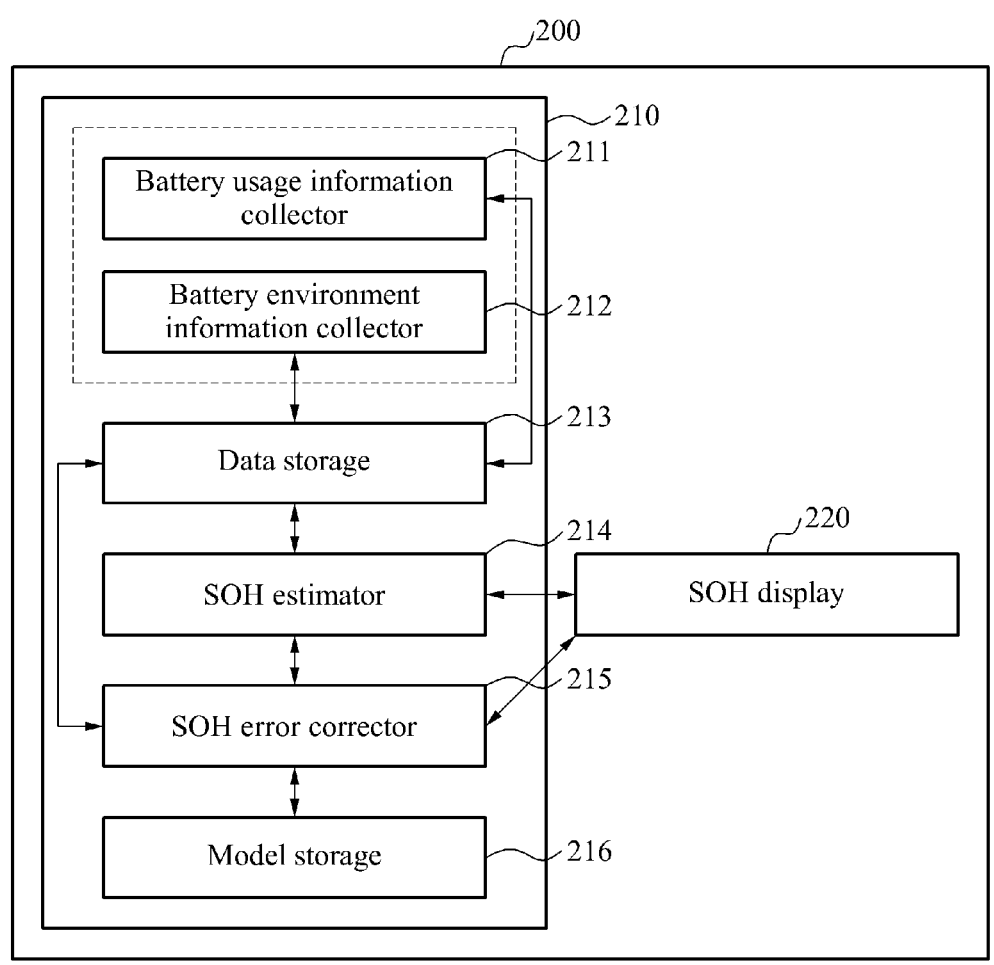
FIG. 2 illustrates an example of a system for estimating a life of a battery.

FIG. 2 illustrates an example of a system 200 for estimating a life of a battery.

Referring to FIG. 2, the system 200 includes an apparatus 210 for correcting an error occurring in estimation of a life of a battery, and an SOH display 220. The apparatus 210 includes a battery usage information collector 211, a battery environment information collector 212, a data storage 213, an SOH estimator 214, an SOH error corrector 215, and a model storage 216. The collector 120 of FIG. 1 may include the battery usage information collector 211 and the battery environment information collector 212.

In the following description, a life degradation parameter refers to a parameter used to reduce a life of a battery. For example, the life degradation parameter may include a use factor and an environmental factor that have an influence on an SOH of the battery. The use factor and the environmental factor in the life degradation parameter will be further described below.

The battery usage information collector 211 collects information on how the battery is used. For example, when an electric vehicle using a battery as an energy source is suddenly accelerated, a rapid discharge state of the battery is maintained. The battery usage information collector 211 records the rapid discharge state.

Additionally, the battery usage information collector 211 collects battery usage information associated with a use factor that has an influence on the SOH of the battery. For example, the use factor of the battery may include a period of time in which the battery is rapidly discharged, a number of times that the battery is rapidly discharged, a period of time in which the battery is rapidly charged, a number of times that the battery is rapidly charged, a rest time after the battery is fully charged, and other information. The battery usage information collector 211 stores the collected battery usage information in the data storage 213 in real time.

The battery environment information collector 212 records an environment to which the battery is exposed. For example, the battery environment information collector 212 may record information associated with a period of time in which the fully charged battery is located in a high temperature place, a rest time during which the battery is not used in an arbitrary place without a separate operation, and other information.

The battery environment information collector 212 also collects battery environment information associated with an environmental factor that has an influence on the SOH of the battery. For example, an environmental factor of the battery may include a period of time in which the battery is exposed to a high temperature place, a period of time in which the battery is exposed to a low temperature place, and other information. The battery environment information collector 212 stores the collected battery environment information in the data storage 213 in real time.

The data storage 213 stores the battery environment information, the battery usage information, and other information. Additionally, the data storage 213 may store a voltage, a current, a temperature, and other parameters of the battery. Furthermore, the data storage 213 may consecutively store values of an SOH estimated by the SOH estimator 214 in chronological order, and may consecutively store values of an SOH corrected by the SOH error corrector 215 in chronological order.

The SOH estimator 214 is similar to the estimator 110 of FIG. 1. For example, the SOH estimator 214 may calculate an SOH from a change in a capacity of the battery estimated by a coulomb counting scheme.

The SOH error corrector 215 is similar to the error corrector 140 of FIG. 1. For example, the SOH error corrector 215 corrects an error occurring in the SOH measured in advance by the SOH estimator 214. The SOH error corrector 215 calculates a weight used to correct an error occurring in the SOH based on data collected by the battery usage information collector 211 and the battery environment information collector 212 from a battery degradation model that is generated in advance.

In one example, a weight calculated based on a battery degradation model that is generated in advance and based on battery usage information and battery environment information that are collected in real time is applied to a value of the SOH estimated by the SOH estimator 214, and thus an accuracy of SOH estimation may be improved.

The model storage 216 is similar to the model storage 130 of FIG. 1. For example, the model storage 216 stores a battery degradation model obtained by modeling a degradation in the battery caused by a use and an environment of the battery.

Additionally, the model storage 216 store normalized battery degradation models for each life degradation parameter, and the data storage 213 may store degrees of influence for each life degradation parameter. The SOH error corrector 215 may reflect the degrees of influence on the normalized battery degradation models, and may calculate a weight corresponding to the collected battery usage information and the collected battery environment information.

The SOH display 220 displays the estimated SOH to a user. Additionally, the SOH display 220 may display the corrected SOH to the user.

Figure 3:
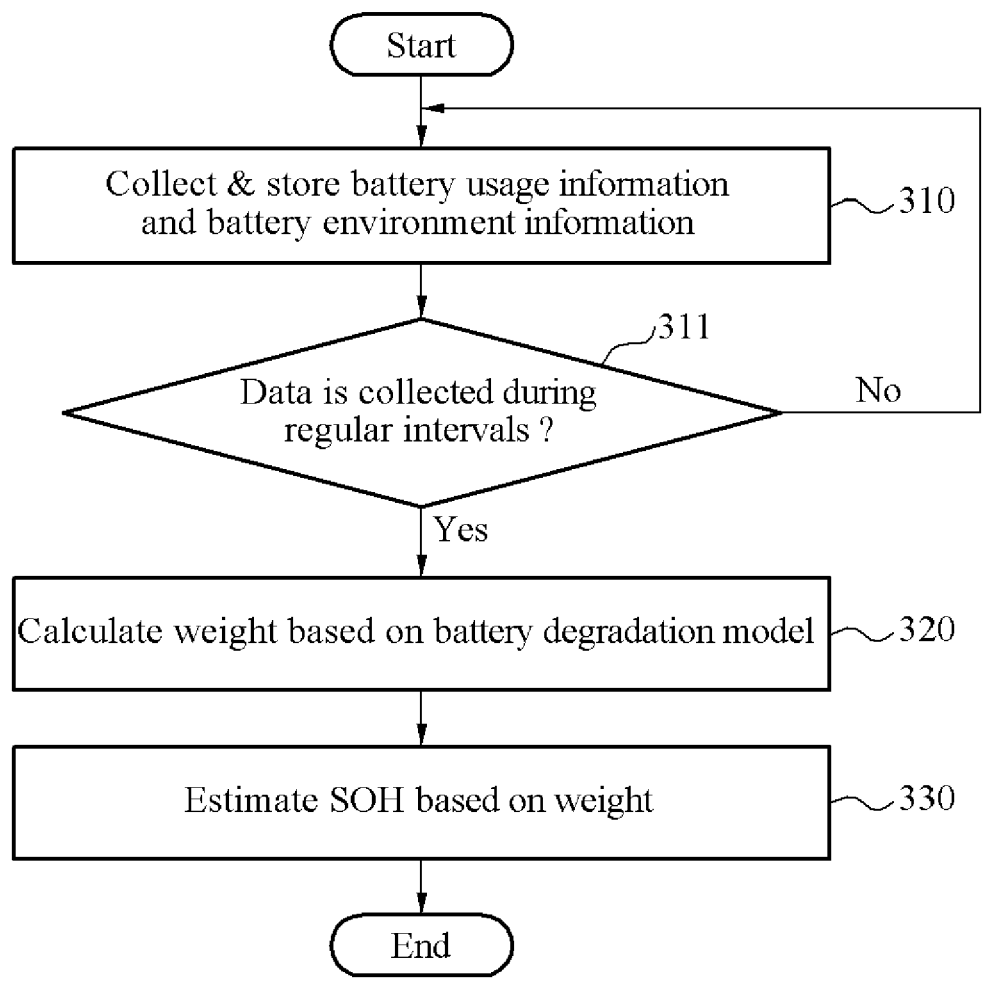
FIG. 3 illustrates an example of a method of correcting an error occurring in estimation of a life of a battery.

FIG. 3 illustrates an example of a method of correcting an error occurring in estimation of a life of a battery.

Referring to FIG. 3, in operation 310, a collector of an apparatus for correcting an error occurring in estimation of a life of a battery collects and stores battery usage information and battery environment information.

In operation 311, the apparatus determines whether data associated with the battery usage information and the battery environment information is collected during regular intervals. If the apparatus determines that the data is not collected during regular intervals, the apparatus returns to operation 310. If the apparatus determines that the data is collected during regular intervals, the apparatus proceeds to operation 320. For example, the regular interval is a predetermined time unit by which continuous data is partitioned for efficiency in processing the data.

In operation 320, an error corrector of the apparatus calculates a weight based on a battery degradation model. For example, the error corrector may calculate a weight corresponding to battery usage information and battery environment information that are collected during regular intervals from the battery degradation model. Additionally, the error corrector may apply a degree of influence to a normalized battery degradation model, and may calculate a weight corresponding to battery usage information and battery environment information.

In operation 330, the error corrector estimates an SOH on which the weight is reflected. For example, the error corrector may add the weight to an SOH estimated by an estimator of the apparatus, and accordingly an accuracy of SOH estimation may be increased.

Figure 4:
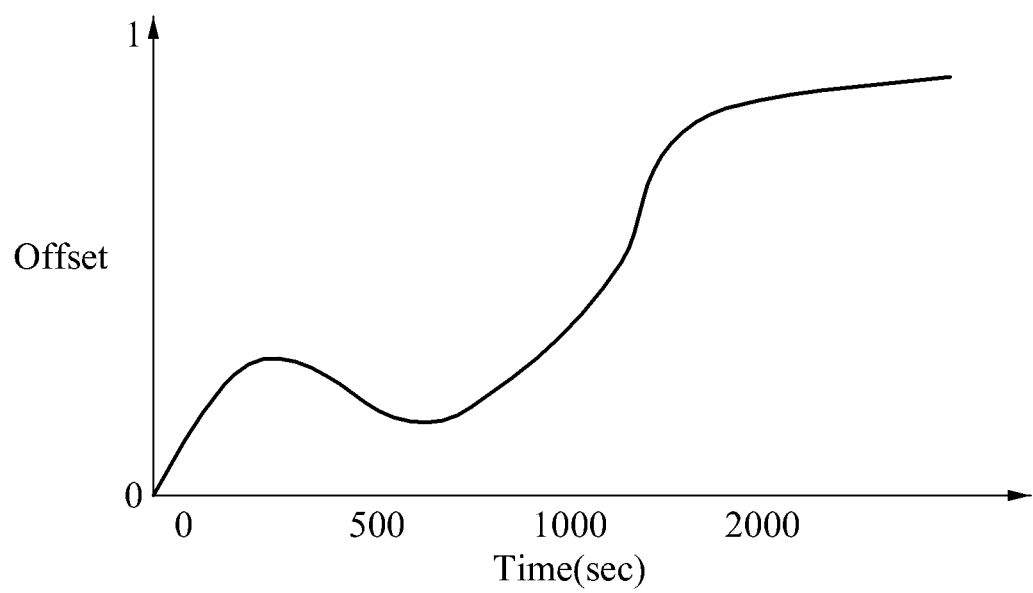
FIG. 4 illustrates an example of a battery degradation model.

FIG. 4 illustrates an example of a battery degradation model.

The battery degradation model of FIG. 4 may be a normalized model, and may have an offset range of "0" to "1." A weight may refer to a value obtained by applying a degree of influence to an offset. For example, an offset may indicate a value obtained by normalizing a weight.

In an example, a normalized battery degradation model W may be represented as shown in Equation 3 below.

$$W = f_1(x, \partial, \emptyset) \quad \text{[Equation 3]}$$

The normalized battery degradation model W may include an offset obtained by modeling a degradation in a battery caused by battery usage information and battery environment information. In Equation 3, X denotes a period of time in which degradations of a battery are accumulated in a predetermined condition, and $\partial$ and $\emptyset$ denote constant values used to calculate the above-described offset.

For example, the normalized battery degradation model W may be generated by performing machine learning (ML) on a degradation in a battery for each life degradation parameter.

A weight calculated by an error corrector from a battery degradation model may be represented as shown in Equation 4 below.

$$SOH_{new} = SOH_{old} + f_2(W, W_{eff}) \quad \text{[Equation 4]}$$

In Equation 4, $SOH_{old}$ denotes an SOH estimated by an estimator. For example, $SOH_{old}$ may be estimated by a coulomb counting scheme. Additionally, $SOH_{new}$ denotes an SOH obtained by applying a weight to $SOH_{old}$. The weight is denoted by $f_2(W, W_{eff})$. In the weight $f_2(W, W_{eff})$, $W_{eff}$ denotes a degree of influence of each life degradation parameter on a reduction in a life of a battery, and $f_2$ denotes a function that reflects the degree of influence $W_{eff}$ on the normalized battery degradation model W.

For example, when at least one life degradation parameter is provided, the error corrector may calculate a weight from a battery degradation model as shown in Equation 5 below.

$$SOH_{new} = SOH_{old} + \sum_{n=1}^{j} f_2(W_n, W_{eff,n}), n = 1, \ldots, j \quad \text{[Equation 5]}$$

In Equation 5, j denotes an integer that is equal to or greater than "1." For example, when "j" life degradation parameters exist, a model storage may store "j" battery degradation models. Additionally, a battery degradation model $W_n$ may be generated from data acquired through a battery degradation test for each life degradation parameter.

Examples of the battery degradation model will be further described with reference to FIGS. 8 through 11.

Figure 5:
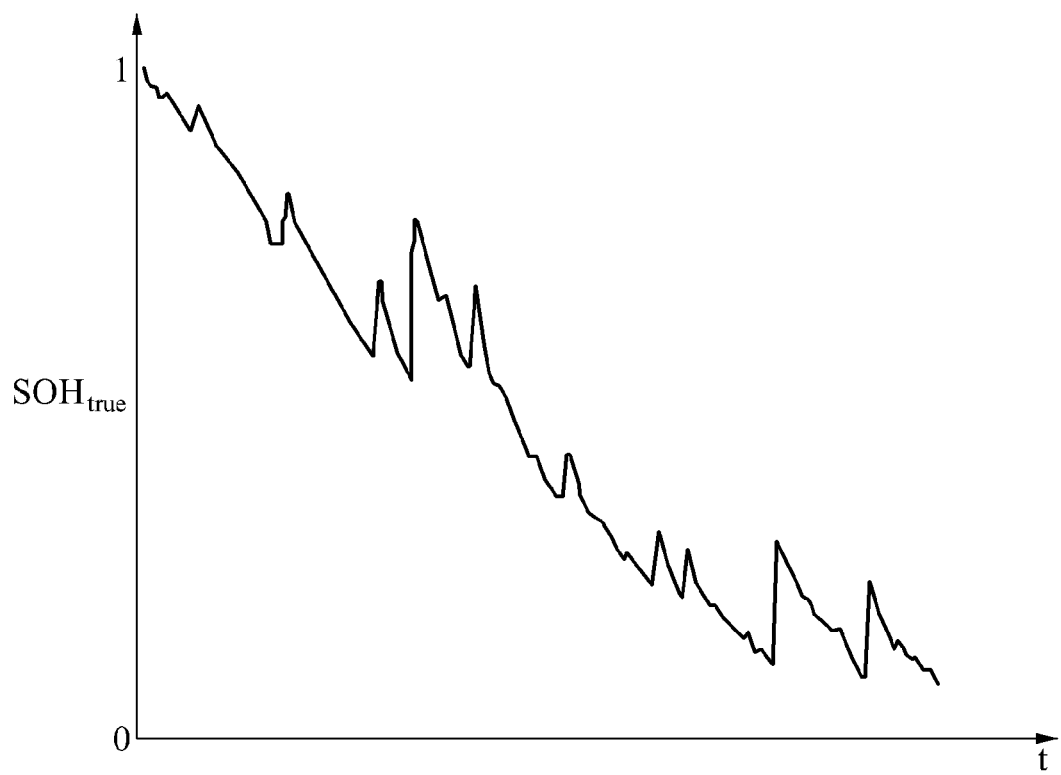
FIGS. 5 and 6 respectively illustrate an example of an actual state of health (SOH) and an example of an estimated SOH.
Figure 6:
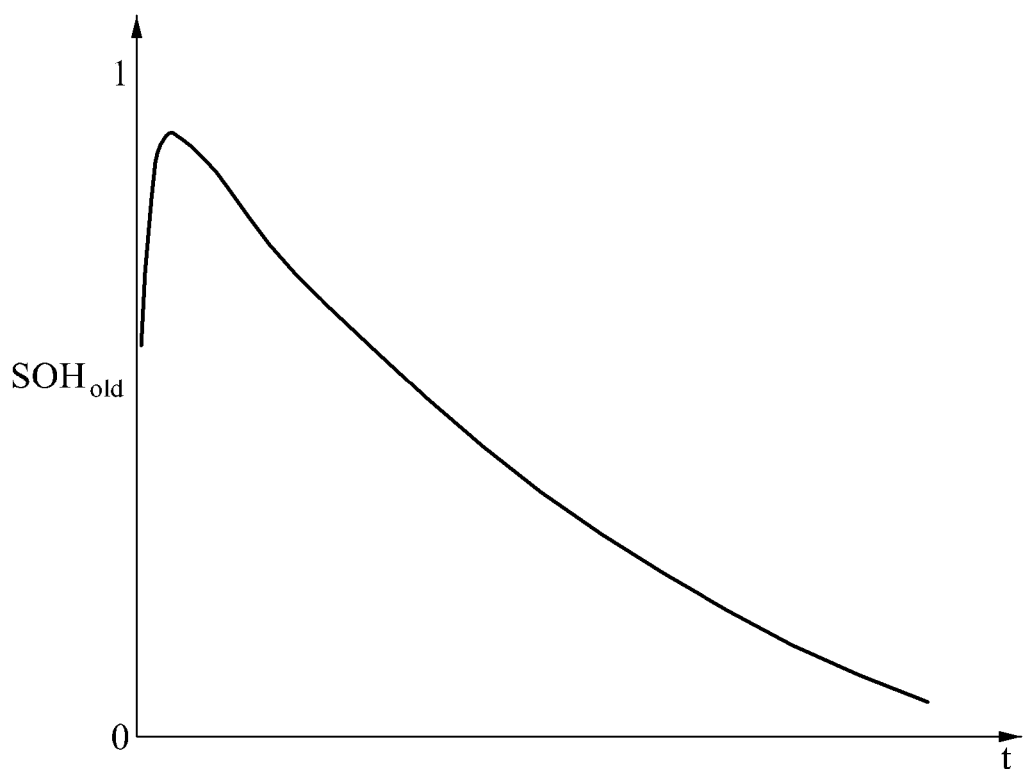

FIGS. 5 and 6 respectively illustrate an example of an actual SOH and an example of an estimated SOH.

FIG. 5 illustrates an example of an actual SOH, that is, $SOH_{true}$. FIG. 6 illustrates an example of an SOH $SOH_{old}$ estimated by an estimator. As illustrated in FIG. 6, the $SOH_{old}$ is approximated compared to the $SOH_{true}$ of FIG. 5.

Comparing $SOH_{true}$ of FIG. 5 and $SOH_{old}$ of FIG. 6, a degree of influence of each life degradation parameter on an SOH may be calculated. For example, an error corrector may calculate a weight by applying a degree of influence to a normalized battery degradation model, and may correct an error between $SOH_{true}$ of FIG. 5 and $SOH_{old}$ of FIG. 6.

Figure 7:
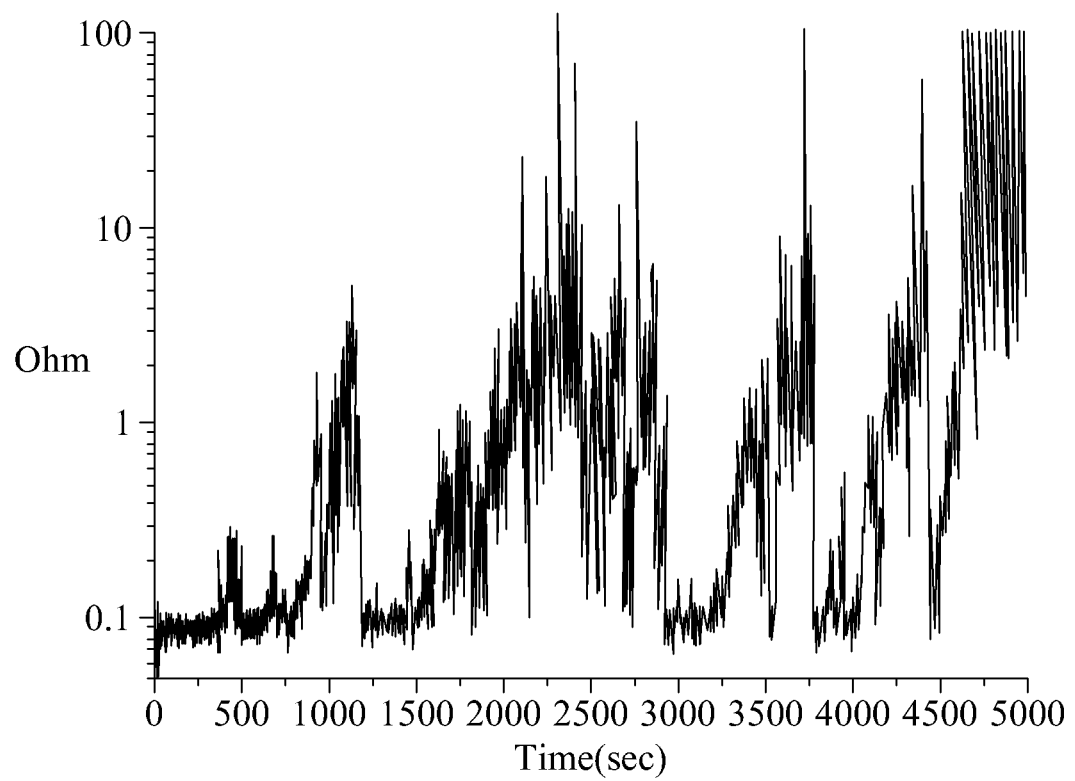
FIG. 7 illustrates an example of an SOH estimated by a coulomb counting scheme.

FIG. 7 illustrates an example of an SOH estimated by a coulomb counting scheme.

The SOH of FIG. 7 is estimated by an estimator. The estimated SOH may be corrected to have a more accurate value by the above-described weight. For example, an SOH may be estimated from an internal resistance of a battery.

FIGS. 8 through 11 illustrate examples of a battery degradation model.

Figure 8:
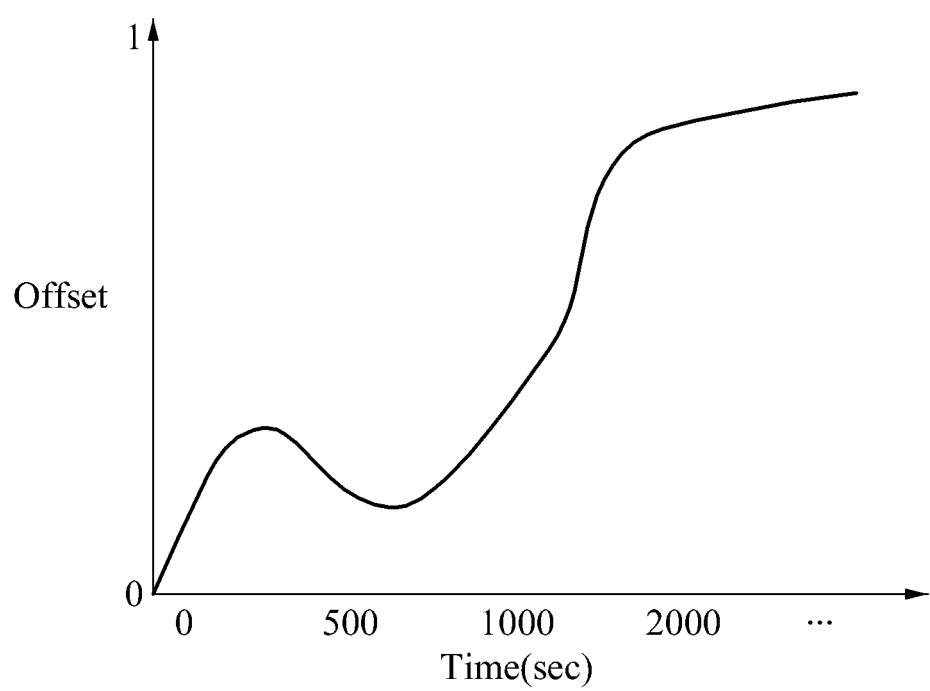
FIGS. 8 through 11 illustrate examples of a battery degradation model.

FIG. 8 illustrates an example of a normalized battery degradation model in which an offset for a rest time in which a fully charged state is maintained is defined in advance. The normalized battery degradation model of FIG. 8 may be referred to as a "rest time model."

The normalized battery degradation model of FIG. 8 may be generated in advance from a result of an experiment indicating that a battery is more quickly degraded than normal when the battery is left in a fully charged state or a fully discharged state. For example, the normalized battery degradation model of FIG. 8 may represent a set of data (for example, a set of offsets) that is acquired from the result of the experiment and indicates a degree of degradation based on a rest time of a fully charged battery. For example, when a battery is mounted in an electric vehicle, the electric vehicle may be keyed off or the ignition of the electric vehicle may be turned off during a rest time.

Figure 9:
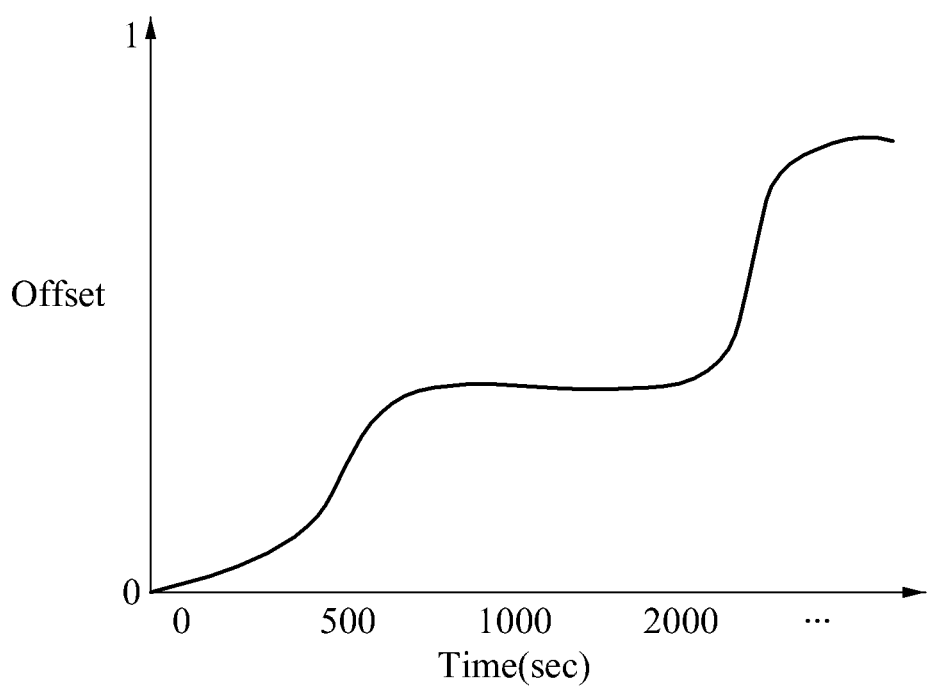

FIG. 9 illustrates an example of a normalized battery degradation model in which an offset for a rapid discharge state is defined in advance. The normalized battery degradation model of FIG. 9 corresponds to a degradation in a battery caused by a rapid discharge of the battery, and may be referred to as a "rapid discharge model."

The rapid discharge state refers to a state in which the battery is discharged by a quantity of electricity that is equal to or greater than a predetermined threshold quantity of electricity, for example, 1 C, 2 C, or 3 C. A charge or discharge current of 1 C is a current that will charge or discharge the battery in one hour. Additionally, the rapid discharge model may include, for example, a first rapid discharge model, a second rapid discharge model, and so forth. The first rapid discharge model may be obtained by modeling a degradation in a battery when a quantity of electricity discharged in the battery is equal to or greater than a first threshold quantity of electricity, for example 1 C. The second rapid discharge model may be obtained by modeling a degradation in a battery when a quantity of electricity discharged in the battery is equal to or greater than a second threshold quantity of electricity, for example 2 C.

However, the number of rapid discharge models and the threshold quantity of electricity for each rapid discharge model are not limited to the above description, and may be arbitrarily set by one of ordinary skill in the art if necessary.

The normalized battery degradation model of FIG. 9 may be generated in advance from a result of an experiment indicating that an SOH is reduced when a battery is rapidly discharged. For example, the normalized battery degradation model of FIG. 9 may represent a set of data that is acquired from the result of the experiment and indicates a degree of degradation caused by a rapid discharge.

A rapid charge model for a rapid charge state, although not illustrated in this application, may be generated in advance similarly to the rapid discharge model of FIG. 9. Additionally, a rapid charge may indicate charging a battery at a speed equal to or higher than a threshold charge speed that is set in advance, and a number of rapid charge models and the threshold charge speed may be arbitrarily set by one of ordinary skill in the art.

For example, when a battery is frequently rapidly discharged and charged, the battery may be further degraded. In this example, a value of an offset indicating a degree of degradation caused by the rapid discharge and the rapid charge may be changed, because batteries have different properties based on their electrolyte.

Figure 10:
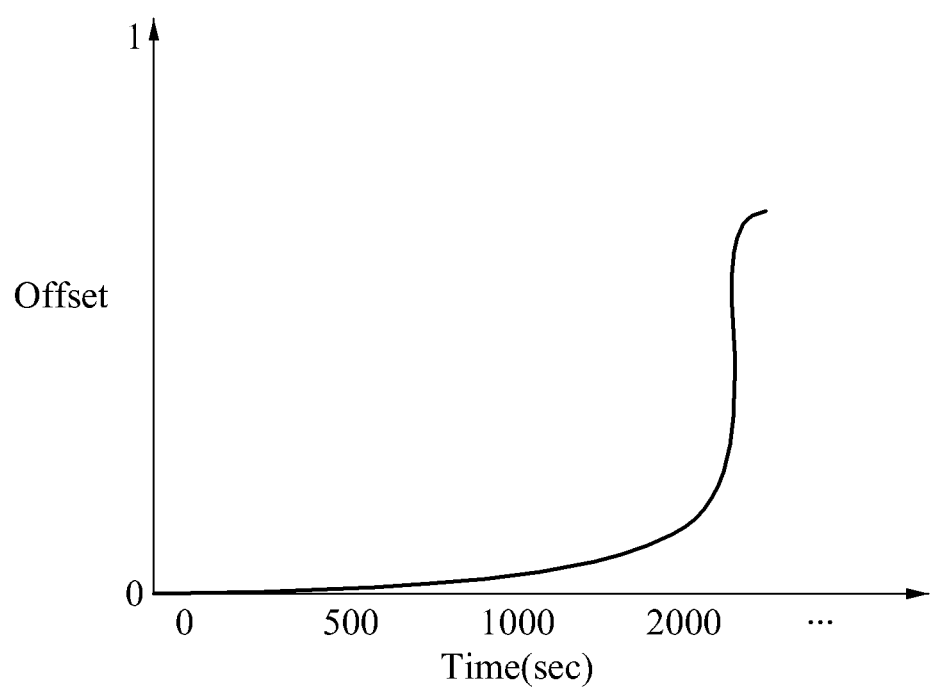

FIG. 10 illustrates an example of a normalized battery degradation model in which an offset for a high temperature state of a battery is defined in advance. The normalized battery degradation model of FIG. 10 corresponds to a degradation of the battery caused by the high temperature state, and may be referred to as a "high temperature model."

The high temperature state is a state in which the battery is exposed to a temperature above a first temperature that is set in advance, for example, 40°. Additionally, the high temperature model may include a model obtained by modeling a degradation in a battery when a temperature to which the battery is exposed is equal to or higher than the first temperature. For example, when the first temperature is set to a plurality of temperatures, for example, a first high temperature threshold and a second high temperature threshold, the high temperature model may include a first high temperature model and a second high temperature model. The first high temperature model may be obtained by modeling a degradation in a battery when a temperature to which the battery is exposed is equal to or higher than the first high temperature threshold. The second high temperature model may be obtained by modeling a degradation in a battery when a temperature to which the battery is exposed is equal to or higher than the second high temperature threshold.

However, the number of high temperature models and the first temperature are not limited to the above description, and may be arbitrarily set by one of ordinary skill in the art if necessary.

The normalized battery degradation model of FIG. 10 may be generated in advance from a result of an experiment indicating an SOH is reduced based on a period of time in which a battery is exposed to a high temperature. For example, the normalized battery degradation model of FIG. 10 may represent a set of data, for example a set of offsets, that is acquired from the result of the experiment and indicates a degree of degradation based on a period of time in which a battery is exposed to a high temperature.

Figure 11:
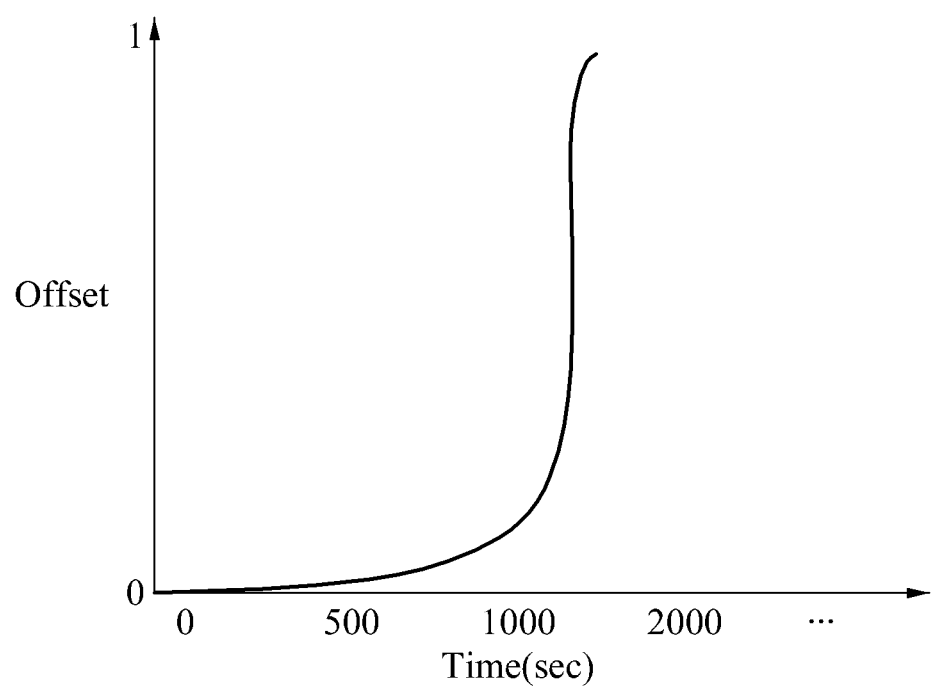

FIG. 11 illustrates an example of a normalized battery degradation model in which an offset for a low temperature state of a battery is defined in advance. The normalized battery degradation model of FIG. 11 corresponds to a degradation of the battery based on the low temperature state, and may be referred to as a "low temperature model."

The low temperature state is a state in which the battery is exposed to a temperature equal to or lower than a second temperature that is set in advance, for example, 10°. Additionally, the low temperature model may include a model obtained by modeling a degradation in a battery when a temperature to which the battery is exposed is equal to or lower than the second temperature. For example, when the second temperature is set to a plurality of temperatures, for example, a first low temperature threshold and a second low temperature threshold, the low temperature model may include a first low temperature model and a second low temperature model. The first low temperature model may be obtained by modeling a degradation in a battery when a temperature to which the battery is exposed is equal to or lower than the first low temperature threshold. The second low temperature model may be obtained by modeling a degradation in a battery when a temperature to which the battery is exposed is equal to or lower than the second low temperature threshold.

However, the number of low temperature models and the second temperature are not limited to the above description, and may be arbitrarily set by one of ordinary skill in the art if necessary.

The normalized battery degradation model of FIG. 11 may be generated in advance from a result of an experiment indicating an SOH is reduced based on a period of time in which a battery is exposed to a low temperature. For example, the normalized battery degradation model of FIG. 11 may represent a set of data, for example a set of offsets, that is acquired from the result of the experiment and indicates a degree of degradation based on a period of time in which a battery is exposed to a low temperature.

For example, a lithium ion battery may be greatly affected by a temperature. Additionally, when a battery continues to be exposed to a high or low temperature state for a relatively long period of time, a degradation of the battery may be accelerated. As illustrated in FIGS. 10 and 11, the battery may be more quickly degraded.

Figure 12:
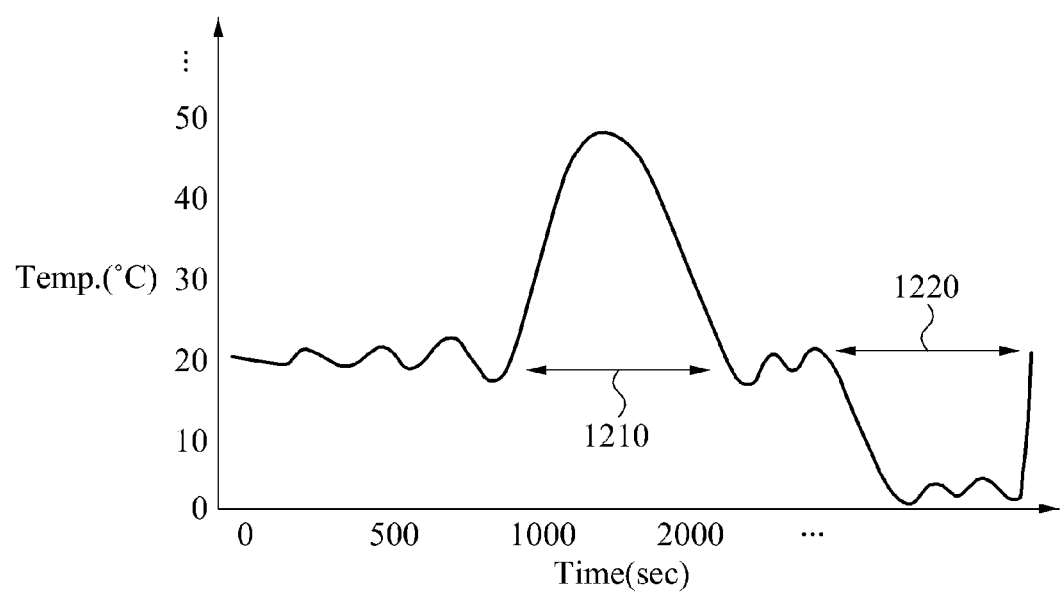
FIGS. 12 through 14 illustrate examples of battery environment information and battery usage information.
Figure 13:
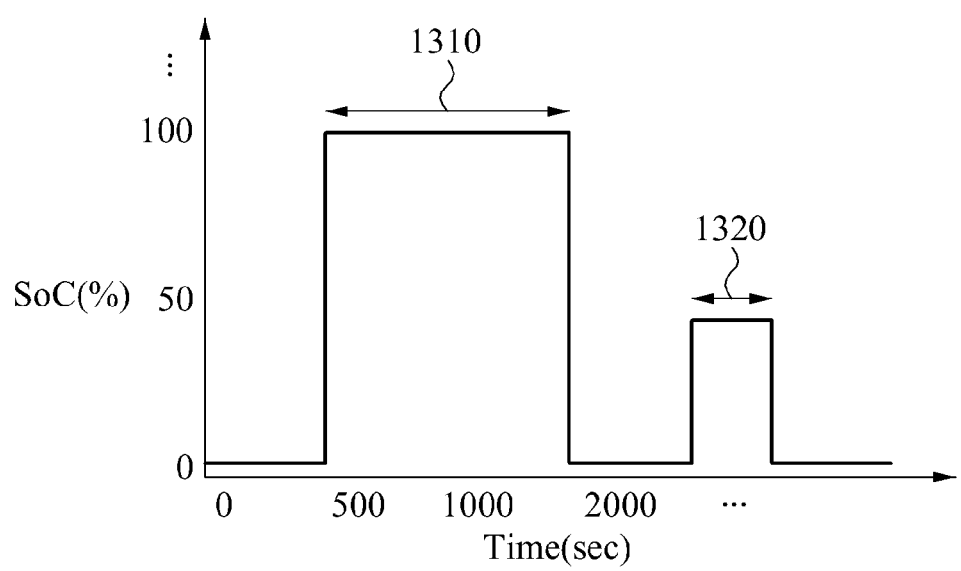
Figure 14:
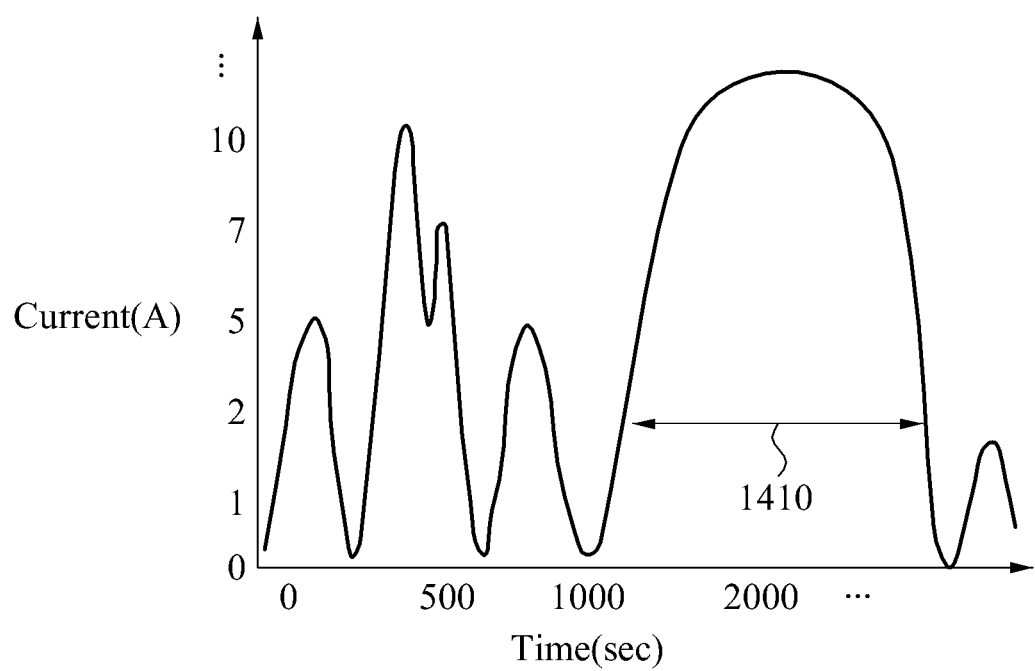

FIGS. 12 through 14 illustrate examples of battery environment information and battery usage information.

FIG. 12 illustrates an example of a period of time in which a battery is exposed to a high temperature or a low temperature that is collected as battery environment information by a collector.

Referring to FIG. 12, the collector collects battery environment information indicating that the battery is exposed to a temperature equal to or higher than a first temperature for a high-temperature exposure period of time 1210, and to a temperature equal to or lower than a second temperature for a low-temperature exposure period of time 1220.

An error corrector calculates a weight corresponding to the high-temperature exposure period of time 1210 from a high temperature model, calculates a weight corresponding to the low-temperature exposure period of time 1220 from a low temperature model, and applies the calculated weights to an SOH estimated by an estimator.

FIG. 13 illustrates an example of a rest time in which a battery is maintained in a fully charged state that is collected as battery usage information by a collector.

As illustrated in FIG. 13, the collector collects battery usage information including a first rest time 1310 in which a fully charged state of a battery is maintained, and a second rest time 1320 in which the battery is maintained in a slightly discharged state.

An error corrector calculates a weight corresponding to the first rest time 1310 and a weight corresponding to the second rest time 1320 from corresponding rest time modes, and applies the calculated weights to an SOH estimated by an estimator.

A state of charge (SoC) illustrated in FIG. 13 indicates a state of charge of the battery. The SoC may be a ratio of a current quantity of electricity stored in the battery to an initial quantity of electricity stored in the battery.

FIG. 14 illustrates an example of a rapid discharge time of a battery that is collected as battery usage information by a collector.

As illustrated in FIG. 14, the collector collects battery usage information indicating that a battery is in a rapid discharge state for a rapid discharge time 1410. For example, a rapid discharge state is a discharge state in which the battery is discharged at a high current.

An error corrector calculates a weight corresponding to the rapid discharge time 1410 from a rapid discharge model, and applies the calculated weight to an SOH estimated by an estimator.

For example, the weights calculated by the error corrector in FIGS. 12 through 14 may be simultaneously applied to $SOH_{old}$ based on Equation 5.

According to various examples, a time to replace a battery may be estimated based on a life pattern or a driving pattern for each individual, according to an environment or pattern in which each user uses a battery, and thus a convenience may be increased.

Additionally, according to various examples, a time to replace a battery may be more accurately estimated, and thus it is possible to prevent, in advance, a problem from occurring due to a battery degradation, which may improve stability.

Furthermore, according to various examples, an apparatus for correcting an error occurring in estimation of a life of a battery may provide a high accuracy of SOH estimation, and accordingly a time to replace a battery may be accurately determined. Thus, it is possible to reduce unnecessary replacement costs.

Moreover, according to various examples, an apparatus for correcting an error occurring in estimation of a life of a battery may enhance accuracy of an SOH, and thus it is possible to obtain an effect of reducing costs, and stability, by replacing a battery.

The estimator 110, the collector 120, the model storage 130, and the error corrector 140 in FIG. 1, and the battery usage information collector 211, the battery environment information collector 212, the data storage 213, the SOH estimator 214, the SOH error corrector 215, and the model storage 216 in FIG. 2 that perform the various operations described with respect to FIGS. 3-14 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state measuring apparatus, the apparatus comprising:
   one or more processors configured to:
      generate battery degradation information based on information of a degree of influence of battery usage information and battery environment information; and
      in response to the battery degradation information being generated,
         perform a first estimation of the SOH corresponding to the life of the battery,
         accumulate periods of time in which the battery is degraded, and
         correct a result of the first estimation of the SOH, to generate a second estimation of the SOH, using offsets obtained from one or more battery degradation models, based on the accumulated periods of time, the battery degradation information, and both of collected battery usage information and collected battery environment information for improving an accuracy in estimating of the SOH by performing the first and second estimation of the SOH; and
      manage the battery based on the second estimation of the SOH.

2. The apparatus of claim 1, wherein the one or more processing devices are further configured to calculate a weight corresponding to the either one or both of the collected battery usage information and the collected battery environment information from the battery degradation information, and correct the estimated SOH based on the weight.

3. The apparatus of claim 1, wherein the battery degradation information comprises at least one of the battery usage information and the battery environment information used to reduce the life of the battery, and the degree of influence of the at least one of the battery usage information and the battery environment information on a reduction in the life of the battery.

4. The apparatus of claim 3, wherein
   the one or more processing devices are further configured to determine at least one normalized battery degradation information obtained by respectively normalizing a degradation in the battery by the at least one of the battery usage information and the battery environment information; and
   the one or more processing devices are further configured to:
   calculate a weight corresponding to the either one or both of the collected battery usage information and the collected battery environment information based on the degree of influence and the at least one normalized battery degradation information, and
   correct the estimated SOH based on the weight.

5. The apparatus of claim 1, wherein the one or more processing devices are further configured to:
   accumulate the periods of time in which the battery is degraded from the either one or both of the collected battery usage information and the collected battery environment information,
   calculate a weight corresponding to the accumulated periods of time, and
   correct the estimated SOH based on the weight.

6. The apparatus of claim 1, wherein the battery degradation information comprises:
   a factor corresponding to a degradation in the battery caused by a rapid discharge of the battery;
   a factor corresponding to a degradation in the battery caused by a rapid charge of the battery;
   a factor corresponding to a full charge of the battery; and a factor corresponding to a degradation in the battery based on a period of time in which the battery is exposed to a predetermined temperature range.

7. The apparatus of claim 1, wherein the collected battery usage information comprises any one or any combination of information associated with a rapid discharge of the battery, information associated with a rapid charge of the battery, and information associated with a full charge of the battery.

8. The apparatus of claim 1, wherein the collected battery environment information comprises either one or both of information associated with a temperature to which the battery is exposed, and information associated with a period of time in which the battery is exposed to a predetermined temperature range.

9. The apparatus of claim 1, wherein the one or more processing devices are further configured to estimate the SOH using a coulomb counting scheme.

10. The apparatus of claim 1, wherein the battery is mounted in an electric vehicle.

11. A processor implemented battery measuring method, the method comprising:
generating battery degradation information based on information of a degree of influence of battery usage information and battery environment information;
in response to the battery degradation information being generated,
performing a first estimation of the SOH corresponding to the life of a battery,
collecting either one or both of battery usage information and battery environment information,
accumulating periods of time in which the battery is degraded, and
correcting a result of the first estimation of the SOH, to generate a second estimation of the SOH, using offsets obtained from one or more battery degradation models, based on the accumulated periods of time, the collected battery usage information and the collected battery environment information for improving an accuracy in estimating of the SOH by performing the first and second estimation of the SOH; and
managing the battery based on the second estimation of the SOH.

12. The method of claim 11, wherein the correcting comprises:
calculating a weight corresponding to the either one or both of the collected battery usage information and the collected battery environment information from the battery degradation information; and
correcting the estimated SOH based on the weight.

13. The method of claim 11, wherein the battery degradation information comprises the at least one of the battery usage information and the battery environment information used to reduce the life of the battery, and the degree of influence of the at least one of the battery usage information and the battery environment information on a reduction in the life of the battery.

14. The method of claim 13, further comprising storing in advance at least one normalized battery degradation information obtained by respectively normalizing a degradation in the battery by the at least one of the battery usage information and the battery environment information;
wherein the correcting comprises:
calculating a weight corresponding to either one or both of the collected battery usage information and the collected battery environment information based on the degree of influence and the at least one normalized battery degradation information; and
correcting the estimated SOH based on the weight.

15. The method of claim 11, wherein the correcting comprises:
accumulating the periods of time in which the battery is degraded from the either one or both of the collected battery usage information and the collected battery environment information;
calculating a weight corresponding to the accumulated periods of time; and
correcting the estimated SOH based on the weight.

16. The method of claim 11, wherein the battery degradation information further comprises:
a factor corresponding to a degradation in the battery caused by a rapid discharge of the battery;
a factor corresponding to a degradation in the battery caused by a rapid charge of the battery;
a factor corresponding to a full charge of the battery; and
a factor corresponding to a degradation in the battery based on a period of time in which the battery is exposed to a predetermined temperature range.

17. The method of claim 11, wherein the collected battery usage information comprises any one or any combination of information associated with a rapid discharge of the battery, information associated with a rapid charge of the battery, and information associated with a full charge of the battery.

18. The method of claim 11, wherein the collected battery environment information comprises either one or both of information associated with a temperature to which the battery is exposed, and information associated with a period of time in which the battery is exposed to a predetermined temperature range.

19. The method of claim 11, wherein the estimating of the SOH comprises estimating the SOH using a coulomb counting scheme.

20. A non-transitory computer-readable storage medium storing a program to control a computer to perform the method of claim 11.

21. The apparatus of claim 1, wherein the apparatus is a battery management system.

22. The apparatus of claim 21, wherein the battery management system is configured to indicate to a user to change the battery when a determined SOH of the battery, based on the second estimation of the SOH, falls below a predetermined threshold.

* * * * *